United States Patent
Moschiano et al.

(10) Patent No.: US 8,169,830 B2
(45) Date of Patent: May 1, 2012

(54) SENSING FOR ALL BIT LINE ARCHITECTURE IN A MEMORY DEVICE

(75) Inventors: Violante Moschiano, Bacoli (IT); Giovanni Santin, Vazia (IT); Tommaso Vali, Latina (IT)

(73) Assignee: Micron Technology, Inc., Boise, ID (US)

( * ) Notice: Subject to any disclaimer, the term of this patent is extended or adjusted under 35 U.S.C. 154(b) by 348 days.

(21) Appl. No.: 12/561,692

(22) Filed: Sep. 17, 2009

(65) Prior Publication Data

US 2011/0063920 A1 Mar. 17, 2011

(51) Int. Cl.
*G11C 16/06* (2006.01)
(52) U.S. Cl. .......... 365/185.21; 365/185.25; 365/189.06
(58) Field of Classification Search ............. 365/185.03, 365/185.11, 185.14, 185.17, 185.19, 185.25, 365/185.28
See application file for complete search history.

(56) References Cited

U.S. PATENT DOCUMENTS

| | | | |
|---|---|---|---|
| 6,347,055 B1 * | 2/2002 | Motomura | 365/189.05 |
| 6,414,880 B1 * | 7/2002 | Yabe et al. | 365/189.05 |
| 7,400,535 B2 | 7/2008 | Li | |
| 7,719,888 B2 * | 5/2010 | Han | 365/185.02 |
| 7,864,589 B2 * | 1/2011 | Sarin et al. | 365/185.21 |
| 7,903,461 B2 * | 3/2011 | Chandrasekhar et al. | 365/185.17 |
| 8,018,770 B2 * | 9/2011 | Ha | 365/185.14 |

* cited by examiner

*Primary Examiner* — Gene Auduong
(74) *Attorney, Agent, or Firm* — Leffert Jay & Polglaze, P.A.

(57) ABSTRACT

Methods for sensing, memory devices, and memory systems are disclosed. One such method for sensing includes charging bit lines of an all bit line architecture to a precharge voltage, selecting a word line, and performing a sense operation on the bit lines. After the sense operation on the memory cells of the first selected word line is complete, the precharge voltage is maintained on the bit lines while a second word line is selected.

27 Claims, 6 Drawing Sheets

US 8,169,830 B2

SENSING FOR ALL BIT LINE ARCHITECTURE IN A MEMORY DEVICE

TECHNICAL FIELD OF THE INVENTION

The present invention relates generally to memory and in a particular embodiment the present invention relates to non-volatile memory.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Non-volatile memory cells are read during a sense operation using sense circuitry (e.g., sense amplifiers). Bit lines are coupled to the sense circuitry that detects the state of a target memory cell by sensing voltage or current on a particular bit line. A typical sense operation includes precharging, to a particular voltage level (e.g., 0.5V), the bit lines coupled to memory cells selected to be read.

During a typical sense operation of a memory block, alternate bit lines coupled to NAND strings of memory cells are read. In other words, an initial sense operation might read the odd bit lines of memory cells while a subsequent sense operation would read the even bit lines of memory cells. Using this alternate bit line procedure, no two adjacent bit lines are read simultaneously. The bit lines that are not being read are typically grounded to provide shielding between bit lines that are being read. This reduces the bit line-to-bit line coupling that can occur as a result of the voltage level on the bit lines changing between sensing.

Since only alternate bit lines of memory cells are read during a sense operation, reading a memory block can take twice as long as reading all of the bit lines simultaneously. One way that has been proposed to decrease the read time of a non-volatile memory device is to read all of the bit lines substantially simultaneously (i.e., an all bit line read (ABL)) using a multi-step sense operation that can reduce the bit line-to-bit line coupling. This is accomplished by measuring the cell current on the bit line by estimating the residual charge remaining on a capacitor coupled to the bit line after a sampling time has elapsed.

FIG. 1 illustrates a timing diagram of a typical prior art multi-step sense operation. This timing diagram shows three different 101-103 sense operations.

The lower waveform 105 shows the sensing trigger signal that signals the beginning of each sense cycle. Each time the sense trigger signal goes from low to high, a new sense operation is performed.

The middle waveform 107 shows the residual charge remaining TDC on the capacitor coupled to the bit line. It can be seen that as one sense operation ends, the capacitor discharges so that TDC starts to go to 0V until the next sense trigger signal causes the capacitor to recharge.

The top waveform 109 shows the bit line voltage for a bit line being read. This waveform also shows the bit line-to-bit line coupling 110, 111 that occurs due to a change in voltage on adjacent bit lines. Before this bit line can be sensed by the sense amplifier, the bit line voltage has to recover to the bit line bias level. Waiting for this recovery period results in a read delay during which the sense amplifiers cannot perform a sense operation.

For the reasons stated above, and for other reasons stated below that will become apparent to those skilled in the art upon reading and understanding the present specification, there is a need in the art to decrease the read time of a memory device.

DETAILED DESCRIPTION

Figure 1:
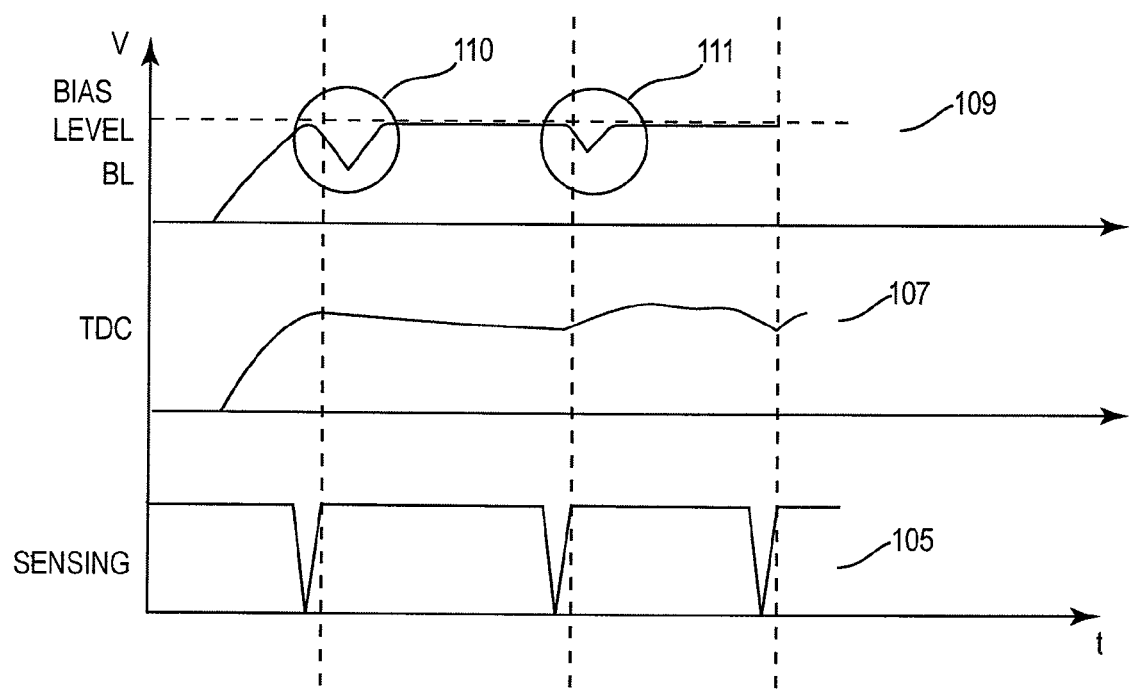
FIG. 1 shows a timing diagram of a typical prior art non-volatile memory sense operation.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
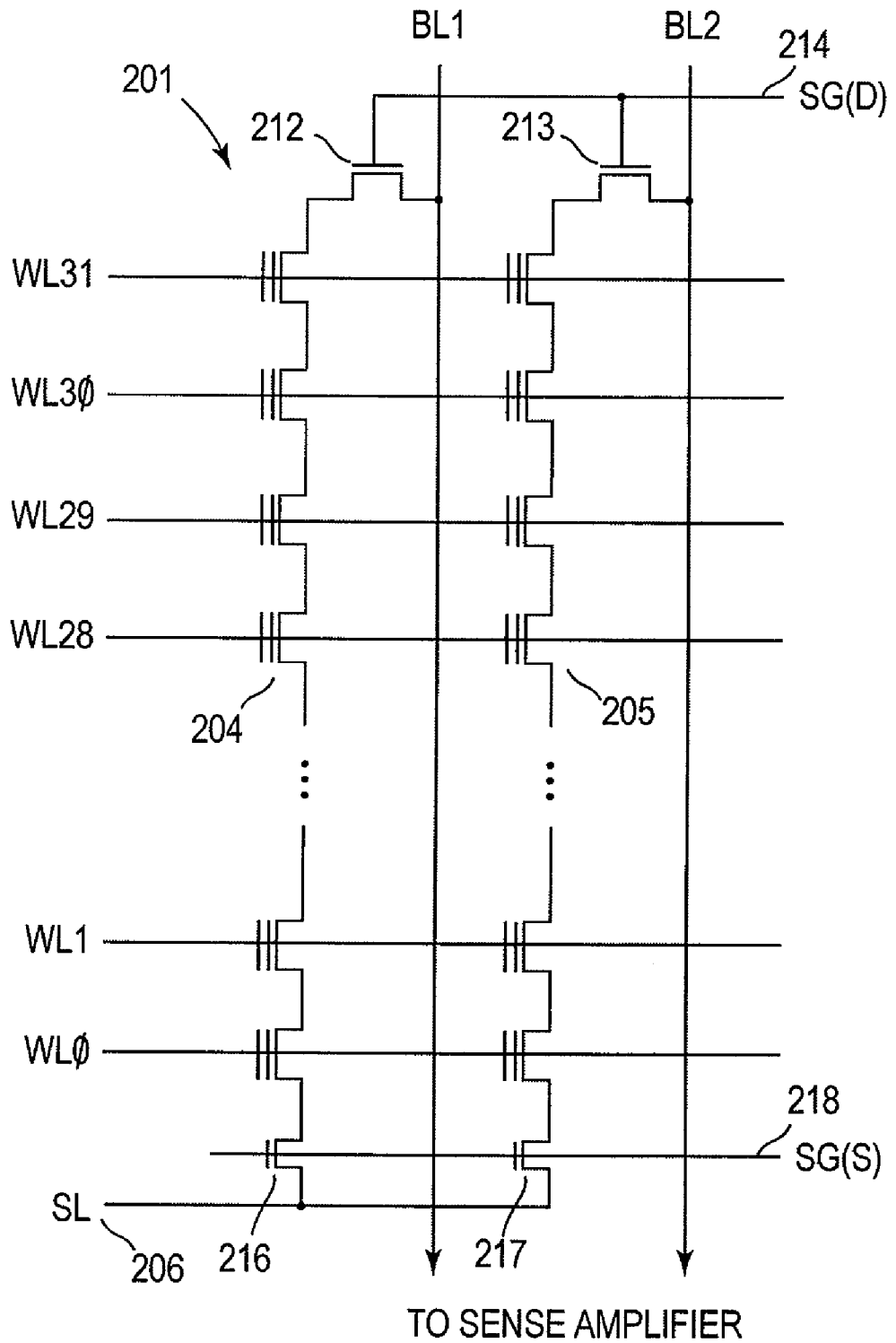
FIG. 2 shows a schematic diagram of one embodiment of series NAND strings of memory cells.

FIG. 2 illustrates a schematic diagram of a portion of a NAND architecture memory array 201 comprising series strings of non-volatile memory cells. While FIG. 2 and the subsequent discussions refer to a NAND memory device, the present embodiments are not limited to such an architecture but can be used in other memory device architectures as well (e.g., NOR, AND).

The memory array 201 is comprised of an array of non-volatile memory cells (e.g., floating gate) arranged in columns such as series strings 204, 205. Each of the cells are coupled drain to source in each series string 204, 205. An access line (e.g. word line) WL0-WL31 that spans across multiple series strings 204, 205 is connected to the control gates of each memory cell in a row in order to bias the control gates of the memory cells in the row. The data lines (e.g., bit lines) BL1, BL2 are eventually connected to sense circuits that detect the state of each cell by sensing voltage or current on a particular bit line. The sense circuits are shown and described subsequently with reference to FIG. 3.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multiple level cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC can have multiple $V_t$ voltage ranges that each indicate a different state.

Figure 3:
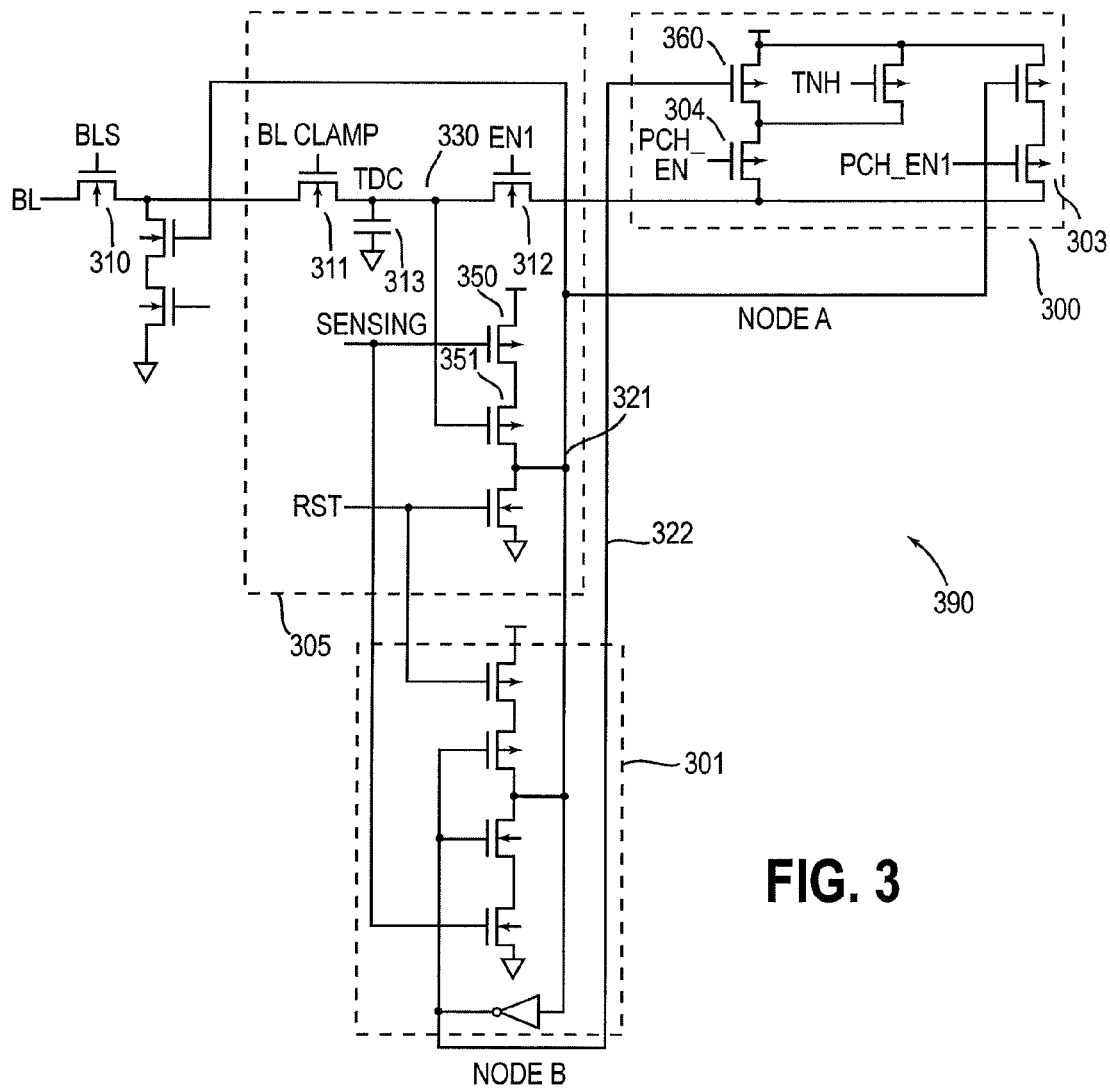
FIG. 3 shows a schematic diagram of one embodiment of an all bit line sense circuit.

FIG. 3 illustrates a schematic diagram of one embodiment of an all bit line sense circuit 390. In one embodiment, this circuit 390 is replicated for each bit line of a memory block or other grouping of memory cells. The sense circuit 390 is generally comprised of a sense amplifier 305, a latch 301, and a precharge circuit 300 comprising precharge transistors 303, 304. Additional circuitry is included to enable and control these functions. The sense amplifier 305 is coupled to its respective bit line through a transistor 310 controlled by a bit line enable signal BLS.

In operation, the sense amplifier 305 is initialized by a reset signal RST that pulls NODE A 321 to ground. A voltage clamp circuit, such as transistor 311, is enabled with a bit line clamp signal BLCLAMP that controls the bit line voltage clamp transistor 311. An isolation circuit, such as transistor 312, is controlled by an enable signal EN1. After the reset, the isolation transistor 312 is enabled to connect the TDC node and the capacitance 313 to the precharge circuit 300.

The precharge circuit 300 precharges the bit line BL through the internal sense node 330 for a particular period of time. This brings the bit line to an optimal voltage, as described subsequently, for sensing the conduction of the selected memory cell.

Once the bit line is precharged, a sensing phase begins where the sense node 330 is sensed by a discriminator circuit that includes two transistors 350, 351. The sensing identifies those memory cells with conduction currents that are higher than a particular level. The two transistors 350, 351 in series serve as a pull-up for NODE A 321. One transistor 350 is enabled by the SENSING signal going low and the second transistor 351 is enabled by the sense node 330 going low. High current memory cells cause the signal TDC to be close to 0V or at least unable for the bit line to be precharged sufficiently high to turn off the transistor 351. For example, if a weak pull up is limited to a current of 500 nA, it will fail to pull up a memory cell with a conduction current of 700 nA.

When the sense amplifier 305 senses a current on the bit line, the latch 301 changes state to a high state so that NODE A 321 goes high and NODE B 322 goes low. Since NODE B is coupled to transistor 360 of the precharge circuit 300, a low on NODE B turns on the transistor 360 and current can then pass through this transistor to recharge the TDC node 330. The bit line is thus maintained at the precharge voltage by the voltage clamp circuit 311 used in a cascade connection. When NODE A 321 is high and the isolation enable signal EN1 is low, the isolation circuit 312 is disabled and the sense node 330 is blocked from the precharge circuit 300.

After the sensing operation, the prior art bit line is pulled to ground and the sensing operation would have to wait for the adjacent bit lines, that have been coupled down, to recover back to their precharge levels before starting another sense operation on the next row of memory cells. However, the bit lines of the present embodiments are maintained at their precharge levels between each of the sense operations such as in order to reduce the bit line-to-bit line coupling. This is accomplished, as described previously, by the change of state of the latch 301 turning on transistor 360 of the precharge circuit 300 such that the TDC node is pulled up to the supply voltage.

The circuit of FIG. 3 is for purposes of illustration only. Alternate embodiments can maintain the precharge voltage on bit lines between sense operations using different circuit elements that operate in a different manner.

Figure 4:
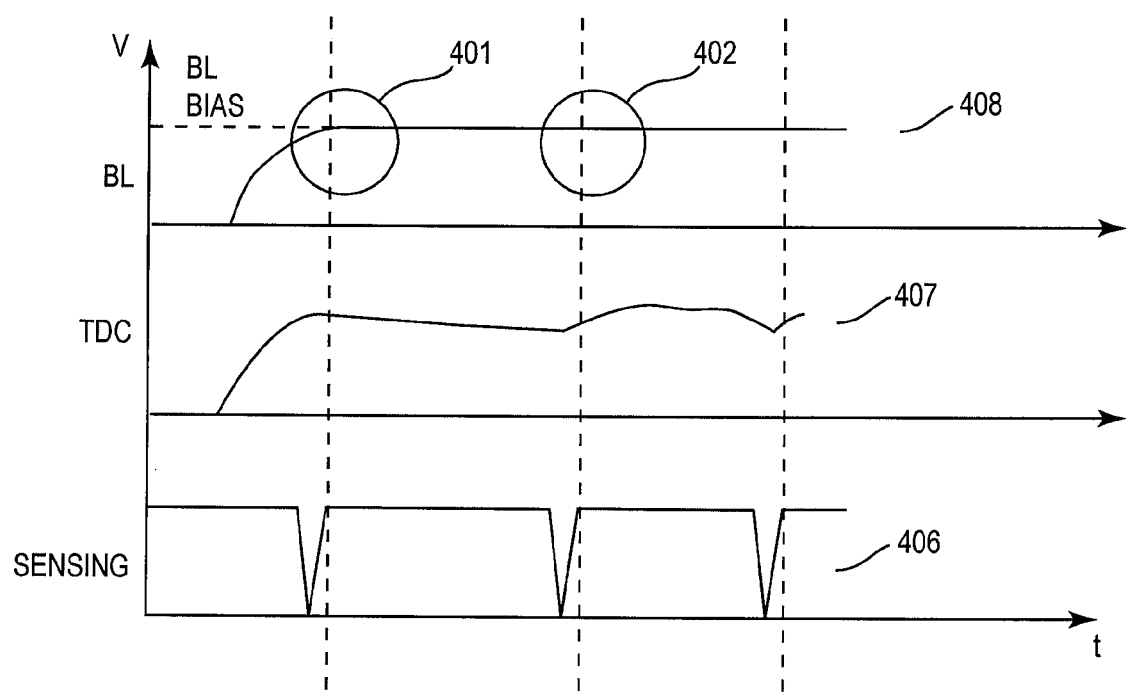
FIG. 4 shows a timing diagram of one embodiment of sense circuit signals in accordance with the circuit of FIG. 3 and the method of FIG. 5.
Figure 5:
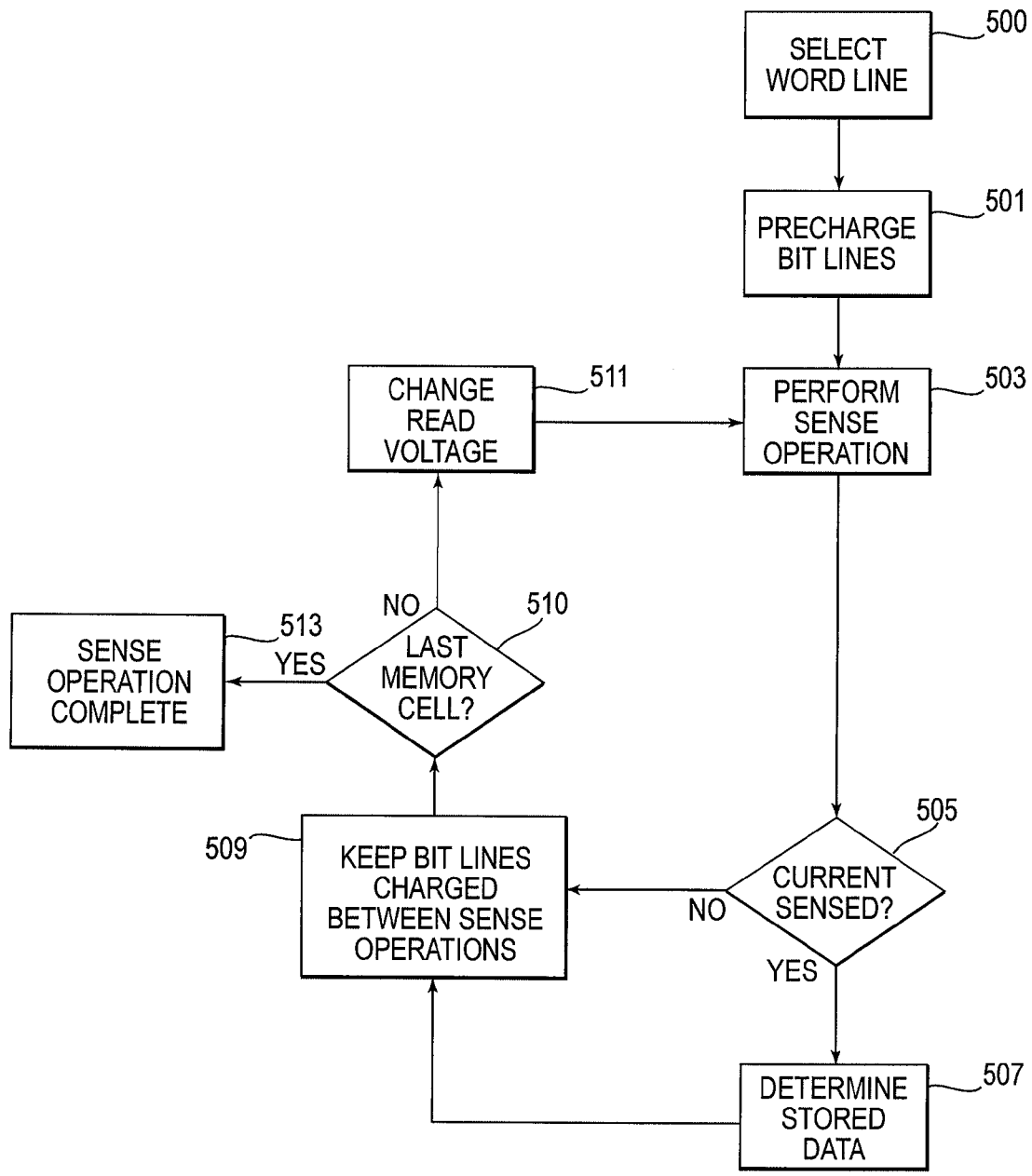
FIG. 5 shows a flowchart of one embodiment of a method for sensing an all bit line architecture.

FIG. 4 illustrates a timing diagram of one embodiment of the above-described sense circuit signals in accordance with the circuit of FIG. 3 and the sense method of FIG. 5. The lower waveform 406 shows that the SENSING signal goes low at the start of every sense operation. The middle waveform 407 shows that the TDC node is kept from discharging during each sense operation as is shown in the prior art TDC waveform. The upper waveform 408 shows that the bit line voltage is thus kept charged to the bit line bias level even during the transitions 401, 402 between sense operations. The same transition areas 110, 111 of FIG. 1 of the prior art showed that these areas required a recovery period prior to a subsequent sense operation. The bit line waveform of FIG. 4 illustrates that this recovery period is not necessary for the present embodiments.

FIG. 5 illustrates a flowchart of one embodiment of a method for sensing an all bit line architecture. A sense operation is performed substantially simultaneously on all of the bit lines of a memory block or other grouping of bit lines as each word line is selected. Thus, when a particular word line is selected, a selected memory cell coupled to both the selected word line and a bit line is selected to be sensed.

After a particular word line is selected 500, the method begins with the precharging of the bit lines to be sensed. The bit lines are precharged to a particular precharge voltage 501. The precharge voltage varies with the conduction current of the selected memory cell. For example, a 400-500 nA conduction current might use a precharge voltage of 0-0.1V. A conduction current below 400 nA might use a precharge voltage of 0.5V that is set by the bit line clamp transistor 311. Thus, in one embodiment, a lower conduction current uses a higher precharge voltage.

A sense operation is then performed 503 as described previously. In one embodiment, a current is sensed. An alternate embodiment can sense a voltage level. If current was sensed 505 on the selected bit line, the stored data is then determined 507. The value of the stored data can be determined by the current or voltage level as compared to a reference current or voltage in order to determine the threshold voltage of the selected memory cell. In an SLC device, presence of a current on the bit line means the selected memory cell is programmed. In an MLC device, the memory cell can be programmed to one of a plurality of different states, each state being represented by a different range of threshold voltages.

When the data from the sensed bit line has been determined 507 or current was not sensed 505 during the sense operation, the bit lines are kept charged between sense operations 509 on each word line. It is determined whether all of the memory cells of the selected word line, or other grouping of memory cells, has been sensed 510. If all of the grouping of memory cells has been sensed 510, the sense operation is complete 513 for that particular word line or memory page.

If the last memory cell of the word line or other grouping of memory cells has not been sensed 510, the method changes the read voltage to the next MLC voltage to be sensed 511. In one embodiment, the read voltage is increased on the word line. The sense operation of FIG. 5 is repeated for other selected word lines of a memory block or other grouping of memory cells as each word line is selected in turn.

Figure 6:
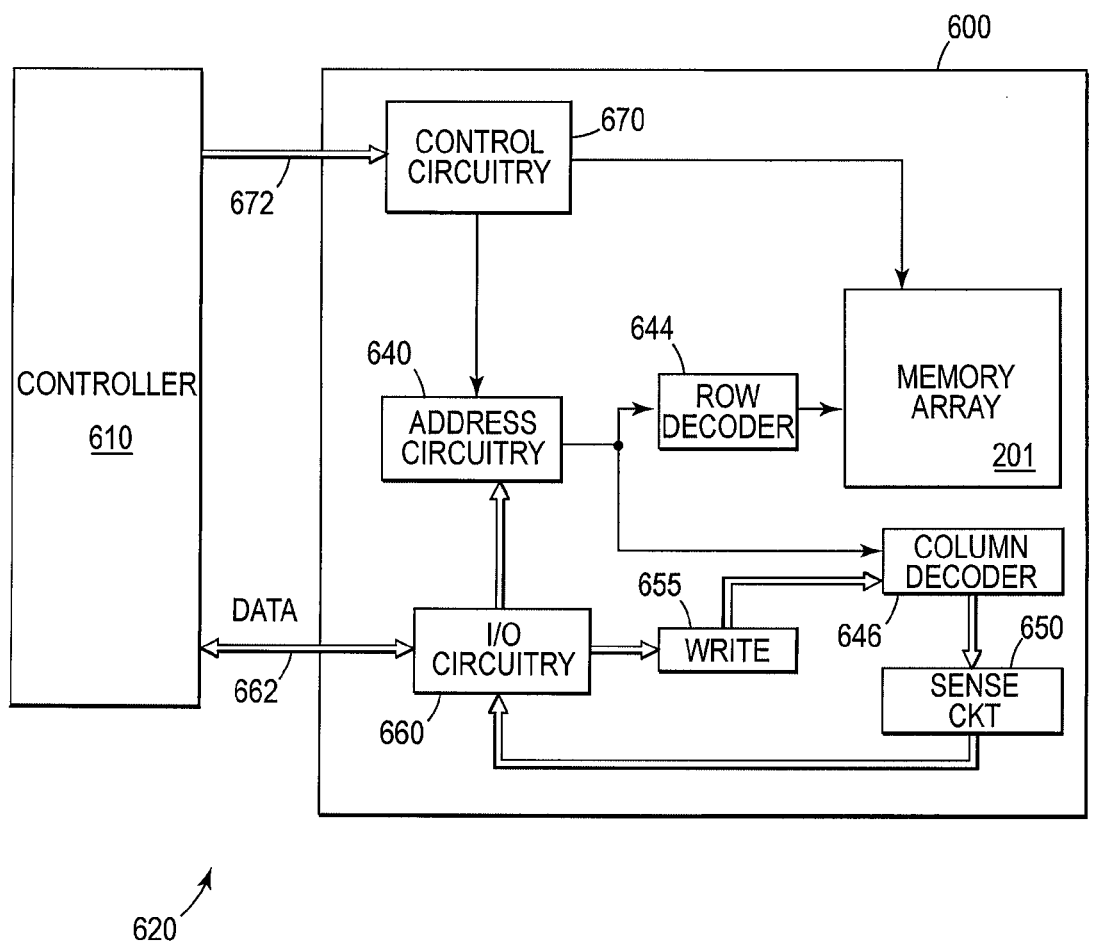
FIG. 6 shows a block diagram of one embodiment of a memory system in accordance with the memory device of FIG. 1.

FIG. 6 illustrates a functional block diagram of a memory device 600. The memory device 600 is coupled to an external controller 610. The controller 610 may be a microprocessor or some other type of controlling circuitry. The memory device 600 and the controller 610 form part of a memory system 620. The memory device 600 has been simplified to focus on features of the memory that are helpful in understanding the present invention.

The memory device 600 includes an array 201 of non-volatile memory cells, such as the one illustrated previously in FIG. 2. The memory array 201 is arranged in banks of word line rows and bit line columns. In one embodiment, the columns of the memory array 201 are comprised of series strings of memory cells as illustrated in FIG. 2. As is well known in the art, the connections of the cells to the bit lines determines whether the array is a NAND architecture, an AND architecture, or a NOR architecture.

Address buffer circuitry 640 is provided to latch address signals provided through the I/O circuitry 660. Address signals are received and decoded by a row decoder 644 and a column decoder 646 to access the memory array 201. It will be appreciated by those skilled in the art, with the benefit of the present description, that the number of address input connections depends on the density and architecture of the memory array 201. That is, the number of addresses increases with both increased memory cell counts and increased bank and block counts.

The memory device 600 reads data in the memory array 201 by sensing voltage or current changes in the memory array columns using sense circuitry 390 as illustrated in FIG. 3 and described previously. The sense circuitry 390, in one embodiment, is coupled to read and latch a row of data from the memory array 201. Data input and output buffer circuitry 660 is included for bidirectional data communication as well as address communication over a plurality of data connections 662 with the controller 610. Write circuitry 655 is provided to write data to the memory array.

Memory control circuitry 670 decodes signals provided on control connections 672 from the external controller 610. These signals are used to control the operations on the memory array 201, including data read, data write (program), and erase operations. The memory control circuitry 670 may be a state machine, a sequencer, or some other type of control circuitry to generate the memory control signals. In one embodiment, the memory control circuitry 670 is configured to execute the embodiments of the sense method of the present disclosure.

The flash memory device illustrated in FIG. 6 has been simplified to facilitate a basic understanding of the features of the memory. A more detailed understanding of internal circuitry and functions of flash memories are known to those skilled in the art.

CONCLUSION

The method and sense circuit of the present embodiments may be used to provide faster sensing in an all bit line architecture. Since the all bit line architecture does not ground alternate bit lines during the sense operation, the charging and subsequent discharging of the bit lines after a sense operation can couple down adjacent bit lines, causing a recovery period to occur prior to a subsequent sense operation. By maintaining the bit lines at the precharge voltage between each of the sense operations for a particular bit line, the adjacent bit lines are not coupled down and no recovery period is necessary.

What is claimed is:

1. A method for sensing in a memory device, the method comprising:
   performing sense operations on each data line of a group of data lines; and
   maintaining, in response to a voltage clamp circuit coupled to each data line, each data line of the group of data lines at a precharge voltage between each of the sense operations.

2. The method of claim 1 wherein the group of data lines is a memory block of data lines.

3. The method of claim 1 and further including precharging the group of data lines to the precharge voltage prior to the sense operations.

4. The method of claim 3 wherein the precharge voltage of each data line is determined in response to a conduction current of a memory cell coupled to its respective data line.

5. The method of claim 1 and further including performing the sense operations on all of the data lines of a group of data lines substantially simultaneously.

6. The method of claim 1 and further including determining data stored in a selected memory cell in response to a current present on a sensed data line.

7. The method of claim 1 wherein each of the sense operations is configured to sense a current on a respective data line that is greater than a particular current level.

8. A method for sensing in a memory device, the method comprising:
   selecting a first access line of a group of memory cells;
   charging a plurality of data lines, of the group of memory cells, to a particular voltage;
   sensing current from selected memory cells on the data lines; and
   maintaining, in response to a voltage clamp circuit coupled to each data line, the particular voltage on the plurality of data lines while selecting a second access line.

9. The method of claim 8 wherein the selected memory cells are all coupled to the first access line and each selected memory cell is coupled to a different data line.

10. The method of claim 8 wherein a sensed current indicates a programmed state of a selected memory cell.

11. The method of claim 10 wherein the programmed state is one of a single level state or a multiple level state.

12. The method of claim 8 and further including selecting, in turn, each access line of the group of memory cells while maintaining the particular voltage on the plurality of data lines.

13. A memory device comprising:
   an array of memory cells coupled to data lines and access lines; and
   sense circuitry coupled to the array of memory cells, the sense circuitry configured to sense the memory cells coupled to a selected access line wherein a precharge voltage is maintained, with a voltage clamp circuit, on the data lines being sensed between sensing of the memory cells coupled to a first selected access line and sensing the memory cells coupled to a second selected access line.

14. The memory device of claim 13 and further comprising memory control circuitry coupled to the array of memory cells and configured to control access line selection during a sense operation on the array of memory cells.

15. The memory device of claim 14 wherein the memory control circuitry is configured to control selection of each of the access lines in turn until all of the memory cells in a memory block have been sensed.

16. The memory device of claim 13 wherein each data line is coupled to a different sense circuit.

17. The memory device of claim 14 wherein the memory control circuitry is further configured to control sensing of all of the memory cells coupled to the selected access line substantially simultaneously.

18. The memory device of claim 13 wherein the sense circuitry is comprised of:
  a sense amplifier circuit;
  a latch circuit coupled to the sense amplifier circuit; and
  a precharge circuit coupled to the sense amplifier circuit and the latch circuit wherein the sense amplifier circuit is configured to set the latch circuit to a particular state, in response to a sensed current, that enables the precharge circuit to maintain the precharge voltage on the data lines between sensing of the memory cells coupled to the first selected access line and the memory cells coupled to the second selected access line.

19. The memory device of claim 18 wherein the latch circuit is coupled to a transistor in the precharge circuit such that the particular state turns on the transistor.

20. The memory device of claim 19 wherein the transistor, when turned on, pulls up a capacitor node in the sense amplifier circuit to a supply voltage.

21. The memory device of claim 18 and further including:
  an isolation circuit coupled to the bit line and configured to isolate the bit line from other circuits.

22. The memory device of claim 21 and further comprising a discriminator circuit coupled between the voltage clamp circuit and the isolation circuit and configured to perform the sensing.

23. A memory system comprising:
  a controller configured to generate memory control signals; and
  a memory device coupled to the controller and configured to operate in response to the memory control signals, the memory device comprising:
    an array of memory cells coupled to bit lines and word lines;
    sense circuitry, having voltage clamp circuitry, coupled to the array of memory cells, the sense circuitry configured to maintain, with the voltage clamp circuitry coupled to each bit line, a bit line voltage greater than ground potential after a sense operation on the memory cells coupled to a first word line.

24. The memory system of claim 23 wherein the memory device is a NAND architecture flash memory device.

25. The memory system of claim 23 and further comprising a memory control circuit coupled to the memory array and configured to select each word line coupled to a group of memory cells in turn until all of the group of memory cells has been sensed while the sense circuitry maintains the bit line voltage between selecting each word line.

26. The memory system of claim 23 wherein the sense circuitry is further configured to sense an all of the bit lines of a block of the memory cells at substantially the same time.

27. The memory system of claim 26 wherein alternate bit lines are not grounded during the sense operation.

* * * * *